(12) United States Patent
Koeda et al.

(10) Patent No.: US 7,909,932 B2
(45) Date of Patent: Mar. 22, 2011

(54) MASK, MASK MANUFACTURING METHOD, FILM FORMING METHOD, ELECTRO-OPTIC DEVICE MANUFACTURING METHOD, AND ELECTRONIC APPARATUS

(75) Inventors: Hiroshi Koeda, Suwa (JP); Shinichi Yotsuya, Chino (JP)

(73) Assignee: Seiko Epson Corporation (JP)

( * ) Notice: Subject to any disclaimer, the term of this patent is extended or adjusted under 35 U.S.C. 154(b) by 1113 days.

(21) Appl. No.: 11/488,835

(22) Filed: Jul. 18, 2006

(65) Prior Publication Data
US 2007/0018265 A1 Jan. 25, 2007

(30) Foreign Application Priority Data
Jul. 20, 2005 (JP) .................. 2005-209536

(51) Int. Cl.
*C23C 16/00* (2006.01)
(52) U.S. Cl. ........................................................ 118/721
(58) Field of Classification Search .................. 118/720, 118/721, 728, 729, 730, 731, 732; 156/345.1, 156/345.11, 345.19, 345.23, 345.3, 345.51, 156/345.52, 345.53, 345.54, 345.55
See application file for complete search history.

(56) References Cited

U.S. PATENT DOCUMENTS

| 4,687,542 A * | 8/1987 | Davis et al. ................... 438/716 |
| 4,915,057 A * | 4/1990 | Boudreau et al. ............. 118/505 |
| 7,396,558 B2 | 7/2008 | Fujimori et al. |
| 2002/0102754 A1* | 8/2002 | Fujimori et al. ................ 438/22 |
| 2004/0123799 A1* | 7/2004 | Clark ............................ 118/504 |
| 2005/0034810 A1* | 2/2005 | Yamazaki et al. .......... 156/345.3 |
| 2005/0118788 A1* | 6/2005 | Kuwahara et al. ............ 438/455 |
| 2005/0133164 A1* | 6/2005 | Fischer et al. ............ 156/345.51 |
| 2006/0150910 A1* | 7/2006 | Han et al. ..................... 118/721 |

FOREIGN PATENT DOCUMENTS

| CN | 1625311 | 6/2005 |
| JP | 2001-237073 | 8/2001 |
| JP | 2002-305079 | 10/2002 |
| JP | 2002-305080 | 10/2002 |
| JP | 2003-100452 | 4/2003 |
| JP | 2003-100460 | 4/2003 |
| JP | 2004-335486 | 11/2004 |

* cited by examiner

*Primary Examiner* — Parviz Hassanzadeh
*Assistant Examiner* — Tiffany Nuckols
(74) *Attorney, Agent, or Firm* — Harness, Dickey & Pierce, P.L.C.

(57) ABSTRACT

A mask includes: a base plate having an opening; a chip having an aperture pattern positioned at the opening in the base plate; a plug detachably arranged to the base plate; and a joining member joining the chip and the plug.

20 Claims, 11 Drawing Sheets

MASK, MASK MANUFACTURING METHOD, FILM FORMING METHOD, ELECTRO-OPTIC DEVICE MANUFACTURING METHOD, AND ELECTRONIC APPARATUS

CROSS-REFERENCE TO RELATED APPLICATION

This application claims priority to Japanese Patent Application No. 2005-209536, filed Jul. 20, 2005, the contents of which are incorporated herein by reference.

BACKGROUND

1. Technical Field

The present invention relates to a mask, a mask manufacturing method, a film forming method, an electro-optic device manufacturing method, and an electronic apparatus.

2. Related Art

An organic electroluminescence (EL) panel, which is a type of electro-optic device, has a self luminous display device having a laminated structure of thin films. A manufacturing process of an organic EL panel includes a film forming step in which a thin film pattern that constitutes a construction layer of the display device is formed on a substrate.

As a method of forming a thin film pattern, an evaporation method that uses a metal mask (for example, refer to Japanese Unexamined Patent Application, First Publication No. 2001-237073) is known. In the evaporation method that uses a metal mask, it is difficult to manufacture a highly precise metal mask that corresponds to a large size substrate on which the film is to be formed. Moreover, since the thermal expansion coefficient of the metal mask is far greater than that of a glass substrate for an organic EL panel, pattern displacement occurs easily.

A method for manufacturing a mask using a silicon substrate, which has a thermal expansion coefficient proximate to that of glass, has been proposed. In this method, an aperture pattern that corresponds to the film forming pattern is formed on a silicon substrate using semiconductor manufacturing techniques, such as photolithography and dry etching.

In the mask manufacturing technique that uses the silicon substrate, the silicon substrate (silicon chip) on which the aperture pattern is formed is attached to a supporting frame of the mask. However, a silicon chip is easily damaged, and it is also difficult to remove the joined state of the silicon chips, and it requires considerable labor to replace the damaged silicon chip.

SUMMARY

An advantage of some aspects of the invention is to make the replacement of chips easy in a mask where a chip having aperture pattern is joined.

According to a first aspect of the invention, there is provided a mask including: a base plate having an opening; a chip having an aperture pattern positioned at the opening in the base plate; a plug detachably arranged to the base plate; and a joining member joining the chip and the plug.

In the mask, detachment of the plug from the base plate enables an easy replacement of the chip. In other words, the damaged chip can be detached from the base plate while it is joined to the plug, and it is unnecessary to remove the joined state by the joining member. Then, even though nonconformity occurs to a portion of chips, the mask does not have to be newly remade, but the mask can be easily repaired by removing the chip(s) where the nonconformity has occurred, replacing it with a new one and mounting the new one onto the base plate. As a result, high quality of the mask responding to upsizing can be economically maintained.

In the mask, the plug may be formed from a material different from that of the base plate. This construction enables the expansion of choices of the joining member.

In the mask, a surface of the base plate may be repellent to a forming material of the joining member, the surface of the base plate being on a side where the chip is arranged. Here, the repellent property means a characteristic to indicate non-affinity to a predetermined material. With this construction, when chips are joined, the flow the joining members onto the base plate can be prevented. As a result, it prevents the replacement of chips from becoming difficult because a joining force is generated at locations other than target one.

In the mask, a surface of the plug may be affirmative to a forming material of the joining member, the surface of the plug being joined to the chip. Herein, the affinitive property is a characteristic to indicate an affinity to predetermined materials. With this construction, when chip is joined, the joining member is preferably arranged on the plug.

In the mask, the joining member can be composed of a photo-curing type and/or a heat-curing type. Even though various types are selectable as the types of the joining member, the curing process with the photo-curing type and/or heat-curing type joining member is easy.

In the mask, the plug may have a plurality of sub-plugs corresponding to the chip being one piece. In this construction, the supporting condition of the chip to the base plate via the plugs becomes stable.

In the mask, the base plate may have a hole in which the plug is inserted, and wherein the plug may have a screw engaged with a bolt that secures the plug in the hole of the base plate. In this construction, the chip can be easily removed by the removal of the bolt from the plug.

In this case, the plug may have a substantially conical shape. In this construction, the position displacement of the plug into the hole of the base plate can be prevented.

Moreover, in this case, the plug may have an asymmetrical shape with respect to the hole of the base plate. In this construction, since the rotation of the plug inside the hole in the base plate is prevented, the plug can be easily removed from the bolt.

In the mask, the base plate may have a hole in which the plug is inserted, and wherein the plug may have a rivet structure. In this construction, the plug is deformed after it is inserted into the hole in the base plate, and is secured to the base plate. Then, the plug secured to the base plate is removed due to deformation.

In this case, it can be constructed such that the plug is made from aluminum or brass. In this construction, the plug can be easily deformed.

Furthermore, in this case, it can be constructed such that the plug is made from a shape-memory alloy. In this construction, for example, heating the plug enables easy deformation of the plug.

In the mask, the base plate has a hole in which the plug is inserted, and wherein the plug is formed from a material, which is magnetically attracted to a magnet. In this construction, the chip can be easily removed from the base plate by detaching the magnet from the plug.

In this case, the plug has a substantially conical shape. In this construction, a position displacement of the plug relative to the hole in the base plate can be prevented.

According to a second aspect of the invention, there is provided a mask including: a base plate having an opening; a chip having an aperture pattern positioned at the opening in the base plate; and a joining member joining the base plate and the chips, wherein a joining force of the joining member is controllable.

In the mask, the chip can be easily replaced by controlling the joining force of the joining member. In other words, the chip can be removed from the base plate, weakening the joining force corresponding to the damaged chip enables the easy removal of the chip from the base plate. Then, even though nonconformity occurs to a portion of the chips, the mask does not have to be newly remade totally, but the mask can be easily repaired by removing only the chip where the nonconformity has occurred, and replacing it to new one and mounting the new one onto the base plate. As a result, the high quality of the mask responding to the upsizing can be economically maintained.

In this case, it can be constructed such that the joining force of the joining member is controlled using at least one of a thermal means, a chemical means and an optical means. Moreover, in this case, the joining member can be composed by including at least one of a hot-melt adhesive, a soluble resin and a polysulfone resin.

According to another aspect of the invention, there is provided a mask manufacturing method including: securing a plug to a base plate; arranging a joining member on the plug; and arranging a chip on the base plate via the joining member on the plug, the chip having an aperture pattern. In this mask, removal of the plug from the base plate enables easy replacement of the chip.

According to another aspect of the invention, there is provided a film forming method that forms a thin film pattern on a substrate using the mask mentioned above. In this film forming method, a thin film pattern can be formed even on a large-sized deposition target substrate with high accuracy, and the mask can be easily repaired.

According to another aspect of the invention, there is provided an electric-optic device manufacturing method that forms a thin film pattern composing a construction layer of the electric-optic device using the film forming method mentioned above. In the manufacturing method, since a thin film pattern with high accuracy is formed, an electro-optic device with high quality can be manufactured. In addition, since a mask can be easily repaired, an electro-optic device with a large screen can be manufactured at a low cost.

According to another aspect of the invention, there is provided an electronic apparatus that includes the electric-optic device manufactured using the manufacturing method mentioned above. The electronic apparatus of the present invention is characterized by being equipped with an electro-optic device manufactured by the manufacturing method of the present invention previously described. Since this electronic apparatus is equipped with an electro-optic device with high quality at low cost, the display quality is improved and low cost is realized.

DESCRIPTION OF EXEMPLARY EMBODIMENTS

Hereunder the present invention is described, with reference to the drawings.

Figure 1:
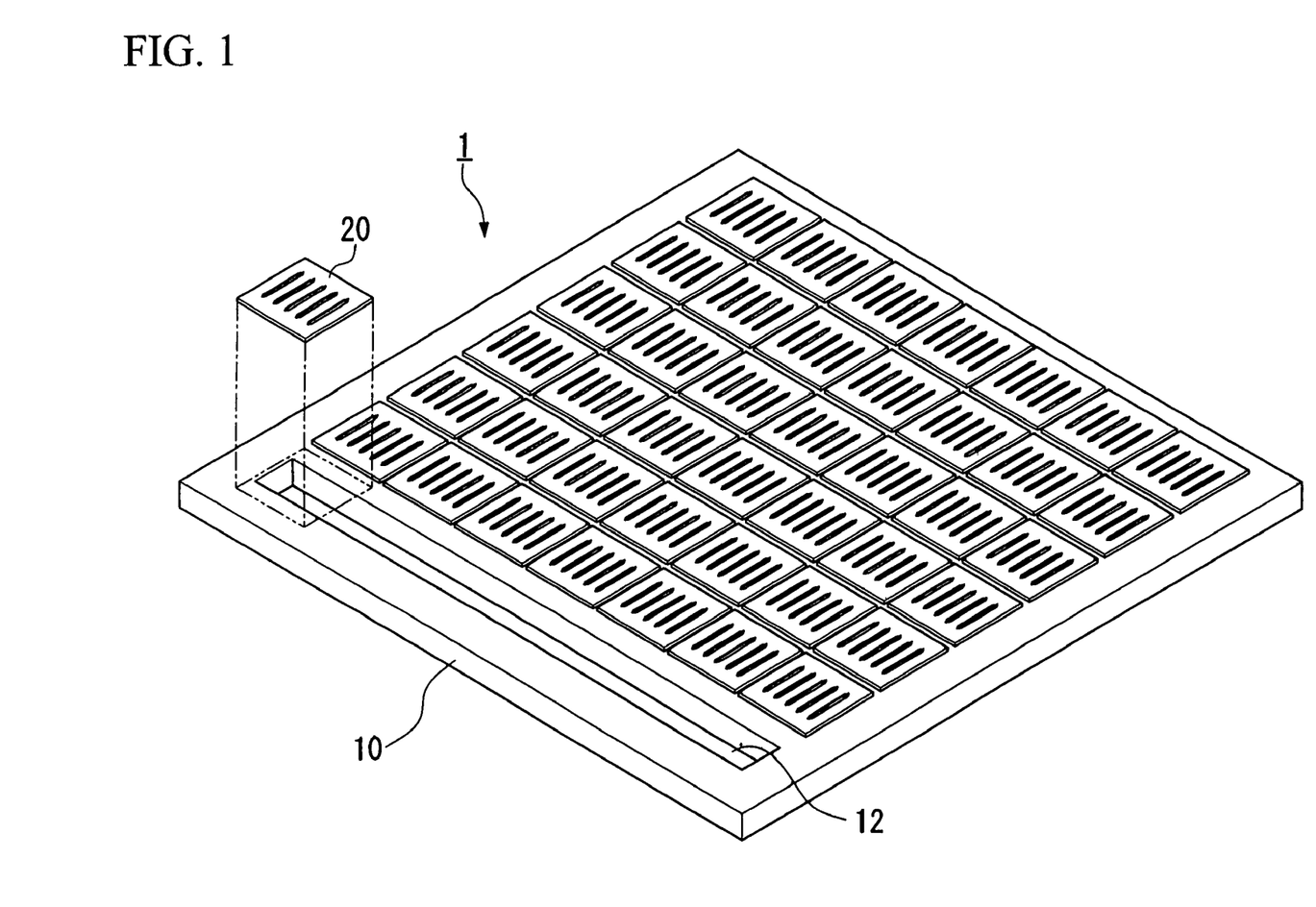
FIG. 1 is a schematic perspective view showing a mask relating to an embodiment of the present invention.
Figure 2:
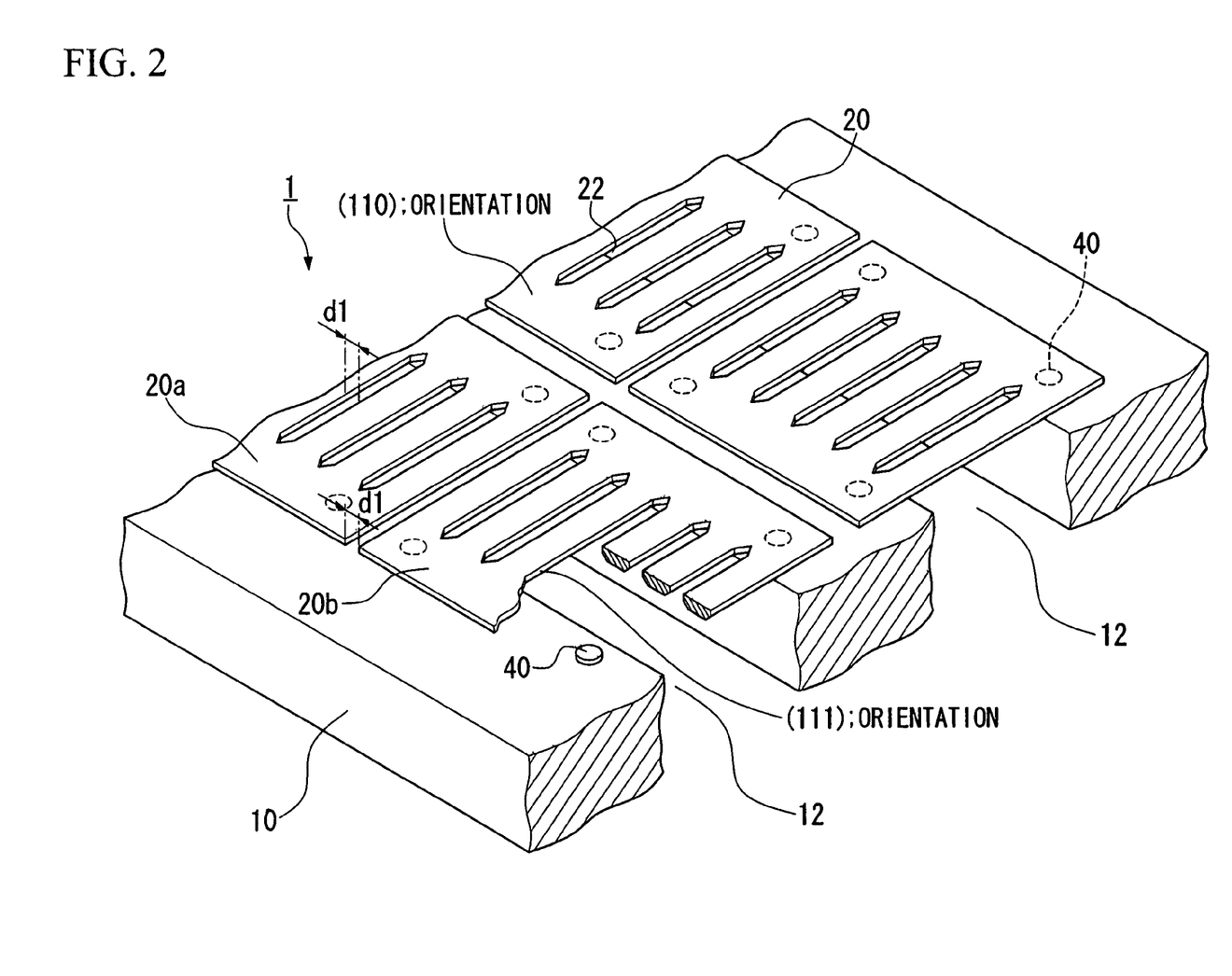
FIG. 2 is an essential part enlarged perspective view of the mask shown in FIG. 1.

FIG. 1 is a schematic perspective view showing a mask relating to an embodiment of the present invention. FIG. 2 is an essential part enlarged perspective view of the mask shown in FIG. 1. A mask 1 of the embodiment can be used, for example, as a vapor-deposition mask.

As shown in FIG. 1 and FIG. 2, the mask 1 has a construction where a base plate 10 where openings 12 are formed and plate-state chips 20 where aperture patterns 22 corresponding to film formation patterns are formed are joined together.

In the present example, the multiple openings 12 are formed in the base plate 10 in parallel; concurrently, the chips 20 are arranged in the multiple openings 12, respectively. In FIG. 1, the seven chips 20 are arranged in one opening 12. However, the number of chips 20 to be arranged in one opening 12 is randomly determined.

More specifically, as shown in FIG. 2, the multiple openings 12 composed of a rectangular through-hole, respectively, are arranged in parallel and at intervals. Aperture patterns 22 having multiple slits, which are arranged at intervals in its crosswise direction, respectively, are established. The chips 20 are accurately positioned relative to the openings 12 of the base plate 10 so as to cover the openings 12 of the base plate 10, and so as to house the aperture patterns 22 within the openings 12 in the base plate 10.

For forming the base plate 10 and the chip 20, it is preferable to use materials that have a thermal expansion coefficient substantially equal to that of the substrate on which the film is to be formed (a later described deposition target substrate 5). In the embodiment, the substrate on which the film is to be formed is made of glass, the base plate 10 is made of glass, and the chip 20 is made of single crystal silicon. The thermal expansion coefficient of single crystal silicone is $30 \times 10^{-7}/°C$. This is substantially equal to the thermal expansion coefficient of Pyrex glass (registered trademark) of Corning Co., Ltd., which is $30\times10^{-7}/°$ C. The thermal expansion coefficient of non-alkali glass OA-10 of Nippon Electric Glass Co., Ltd. is $38\times10^{-7}/°$ C. Moreover, as a material that has a thermal expansion coefficient substantially equal to that of glass, there is a metal material 42 alloy (thermal expansion coefficient: $50\times10^{-7}/°$ C.) and an invar material (thermal expansion coefficient: $12\times10^{-7}/°$ C.). Since the thermal expansion coefficients of the base plate 10 and the chip 20 are substantially the same as each other, distortion or deflection of the base plate 10 and the chip 20 due to a thermal expansion coefficient difference can be prevented. Since the base plate 10 and the chip 20 and the substrate on which the film is to be formed have substantially the same thermal expansion coefficients as each other, position displacement of the film forming pattern due to thermal expansion coefficient difference can be prevented.

The aperture pattern 22 of the chip 20 made of silicon can be formed by means of anisotropic etching. For example, since the chip 20 has a plane direction (orientation) (110) or a plane direction (orientation) (100), and the sidewall surface in a lengthwise direction of the respective slits of the aperture pattern 22 on the chip 20 has a plane direction (orientation) (111), an aperture slit (aperture pattern 22) can be easily formed by means of crystal anisotropic etching.

The position of the chip 20 with respect to the base plate 10 is determined, for example, based on the observation result of alignment marks that have been respectively formed on the base plate 10 and the chip 20. Furthermore, by employing a photolithography technique or a blasting technique, the alignment marks can be formed on the base plate 10 made of glass. Moreover, by employing a photolithography technique or crystal anisotropic etching, the alignment marks can be formed on the chip 20 made of silicon.

As shown in FIG. 2, adjacent chips 20a and 20b, which are the chips 20 to cover the opening 12 of the base plate 10, are arranged at an interval that is the same as each slit width d1 of the aperture patterns 22. A gap between the chips 20a and 20b similarly functions as a slit of the aperture patterns 22 of the chips 20, and the gap functions as an aperture of the mask 1 for forming a thin film pattern with the desired configuration. The multiple chips 20 are arranged on the base plate 10 in a matrix at intervals, respectively.

Herein, each corner of the chip 20 on the rear surface (four corners in the embodiment) is secured to the edge of the opening 12 of the base plate 10 via the joining member 40.

Figure 3:
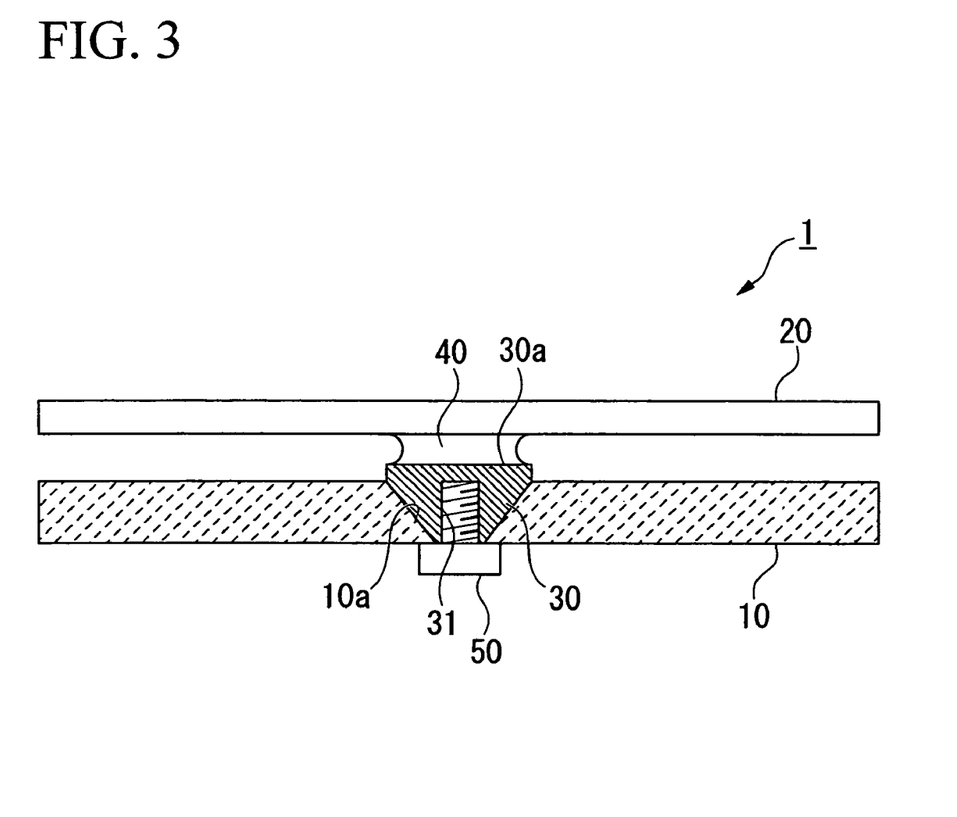
FIG. 3 is a schematic cross-sectional view showing a junction structure of a chip to a base plate.

FIG. 3 is a schematic cross-sectional view showing the junction structure of the chip 20 on the base plate 10. As shown FIG. 3, a hole 10a is established in the base plate 10. The plug 30 is inserted into this hole 10a. One surface of the plug 30 (joint surface 30a) and one surface of the chip 20 (internal surface) are joined via the joining member 40.

Figure 4:
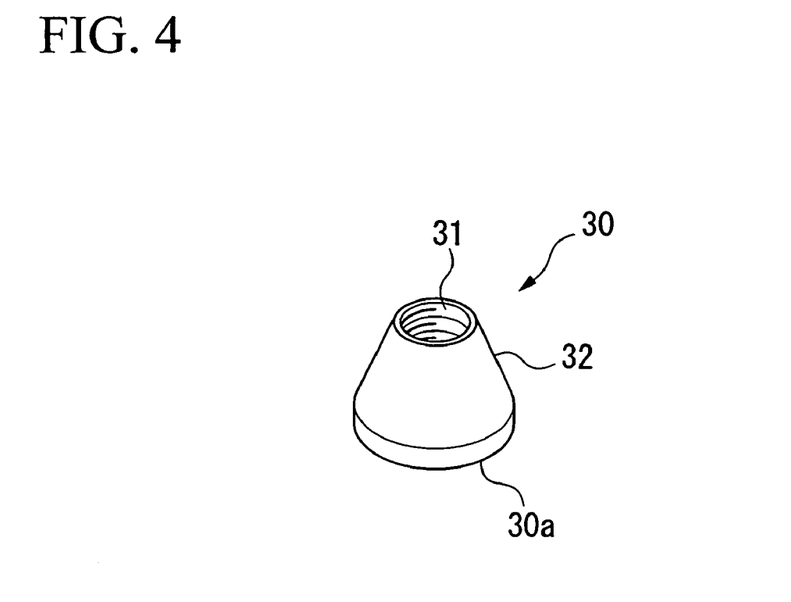
FIG. 4 is a perspective view showing a plug configuration example.

FIG. 4 is a perspective view showing a configuration example of the plug 30. The plug 30 in FIG. 4 is overall composed of a substantially conical shape. A top of the plug 30 is processed to be a plane vertical to the central axis, and a screw 31 with predetermined depth is established at the top.

Returning to FIG. 3, the plug 30 is inserted into the inside of the hole 10a in the base plate 10 from the top as a head. The hole 10a of the base plate 10 is formed by having a slope based upon the configuration of the plug 30. The slope of the hole 10a in the base plate 10 and the slop 30a of the plug 30 are in a scaling relationship, and these are close with each other. The plug 30 inserted into the hole 10a of the base plate 10 is secured to the base plate 10 by a bolt 50. The bolt 50 is arranged from the surface at the opposite side of the plug 30 relative to the base plate 10. For the purpose of prevention of looseness, an elastic adhesive can be arranged on the screw 31 of the plug 30, or a spring washer can be arranged between the plug 30 and the bolt 50.

Moreover, the joint surface 30a of the plug 30 inserted into the hole 10a in the base plate 10 is positioned higher compared to the surface (internal surface) of the base plate 10. The joining member 40 is arranged on the joint surface 30a of the plug 30 and between the plug 30 and the chip 20. As described above, the chips 20 are arranged on the base plate 10 by securing the plugs 30 to the base plate 10 by the bolt 50; concurrently, by joining the chips 20 with the plugs 30 by the joining members 40.

In this junction structure, a chip can be easily replaced by removal of the plug 30 from the base plate 10. The plug 30 can be easily removed by the removal of the bolt 50. In other words, the removal of the bolt 50 from the plug 30 enables each removal of the chip 20 from the base plate 10.

Therefore, in the mask 1 of the embodiment, a damaged chip 20 can be removed from the base plate 10 while it is joined to the plug 30, and it is unnecessary to remove the joined state by the joining member 40. Even though nonconformity occurs to a portion of the chip among the multiple chips 20 (refer to FIG. 1) arranged in the mask 1, the mask 1 can be easily repaired by removing the chip where nonconformity has occurred and by replacing it with new one and mounting it onto the base plate 10 without totally remaking the mask 1. As a result, high quality of the mask 1 corresponding to upsizing can be economically maintained.

Moreover, in the embodiment, because the configuration of the plug 30 is substantially conical, the slope 30b of the plug 30 makes close contact with the internal wall surface (slope) of the hole 10a in the base plate 10, and it is difficult for a position displacement based upon the gap between the hole 10a in the base plate 10 and the plug 30 to occur. In other words, the radial position displacement of the plug 30 relative to the hole 10a of the base plate 10 is prevented. In addition, in the embodiment, the plugs 30 are arranged in a plurality of positions on one chip 20, and the chips 20 are joined to the base plate 10 at each position, so the supporting condition of the chips 20 to the base plate 10 via the plugs 30 is stable. As a result, the position displacement of the chips 20 relative to the base plate 10 is prevented.

As a forming material of the joining member 40, well-known various materials having a joining function (or adhesive function) are applicable, and for example, a hardening material, such as thermosetting joining member or an optical hardening resin, is used. For example, the UV cured resin is cured by the UV irradiation with 365 nm of wavelength easily and for a comparatively short time. Moreover, as a forming material of the plugs 30, for example, metal and resin are used. The joining member 40, which is preferable to join the chip 20, is selected, and the material of the plugs 30 can be selected according to this. Alternatively, the plug 30, which is preferably compatible with the base plate 10 and excels in the processability, is selected, and the material of the joining member 40 can be selected according to this. Since the plug 30 is formed from a different material from the base plate 10, the range of choice for the material of the joining member 40 can be greater.

Figure 5A:
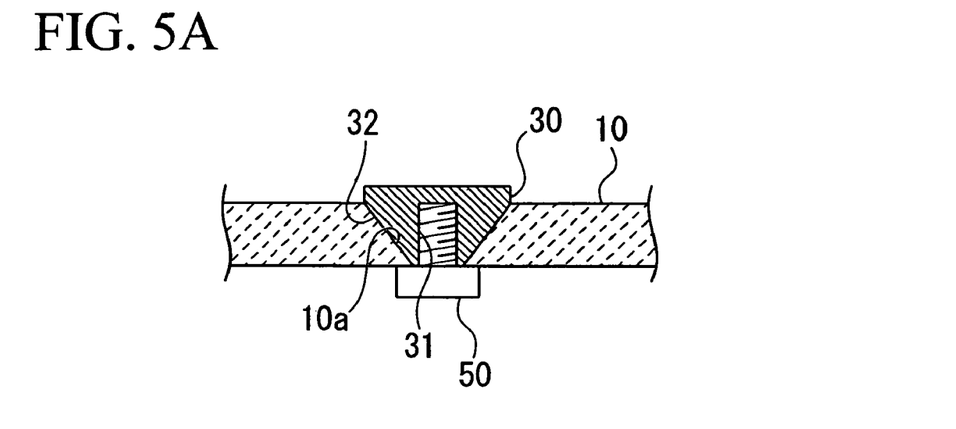
FIGS. 5A, 5B, and 5C are views for explaining the mask manufacturing method, and these show one example of procedures to mount the chip onto the base plate.
Figure 5B:
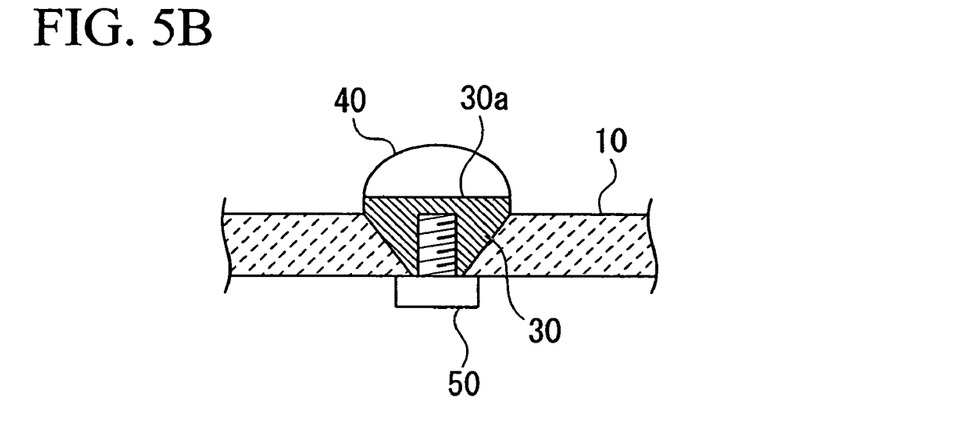
Figure 5C:
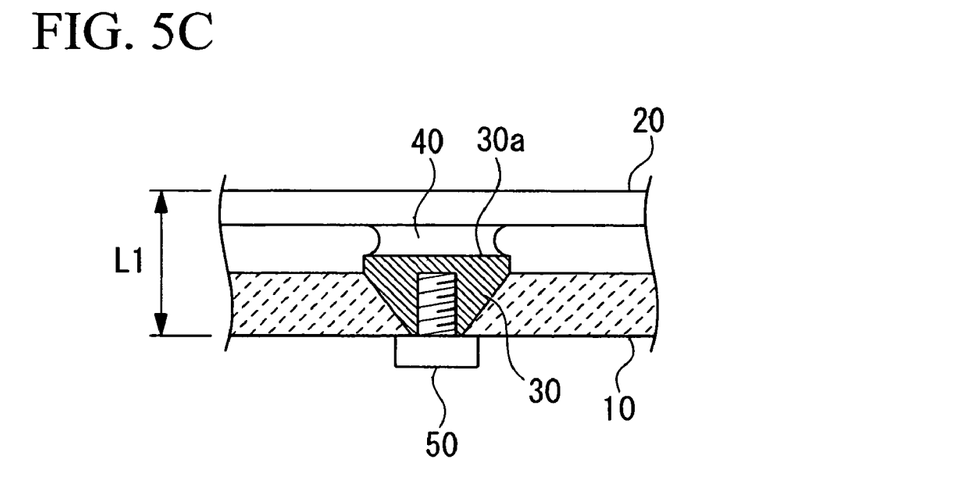

FIGS. 5A, 5B and 5C are diagrams for explaining the manufacturing method for the mask 1, and these show one example of procedures to mount the chips 20 on the base plate 10. As shown in FIGS. 5A to 5C, this manufacturing method is comprised of a process to mount the plug 30 onto the base plate 10 (FIG. 5A), a process to arrange the joining member 40 on the plug 30 (FIG. 5B) and a process to arrange the chip 20 on the base plate 10 via the joining member 40 on the plug 30 (FIG. 5C).

Specifically, first, as shown in FIG. 5A, the plug 30 is inserted into the inside of the hole 10a of the base plate 10 from the top. The plug 30 is secured to the base plate 10 by the bolt 50 from the opposite side.

Next, as shown in FIG. 5B, the joining member 40 is arranged on the joint surface 30a of the plug 30. For the arrangement of the joining member 40, even though an inkjet method and a dispenser method can be applicable, especially the inkjet method is preferably used because a desired amount of material can be arranged at a desired position. Alternatively, the joining member 40 can be arranged by securing a dry film.

Next, as shown in FIG. 5C, the chip 20 is arranged on the base plate 10 via the joining member 40 on the plug 30; concurrently, the joining member 40 is cured. At this time, the chip 20 is positioned in the plane direction (orientation) relative to the base plate 10. For this positioning in the plane direction (orientation), as described above, an alignment mark is formed to the base plate 10 and the chip 20, respectively, and the positioning can be conducted based upon the observation result of the alignment marks.

At this time, the chip 20 is further positioned in the height direction relative to the base plate 10, as well. This positioning in the height direction is conducted, for example, by adjusting the position relationship in the height direction between the chip 20 and the base plate 10 to be a desired situation, and by curing the joining member 40 in this situation. The position relationship in the height direction is provided, for example, as shown in FIG. 5C, by a distance L1 between the external surface of the base plate 10 and that of the chip 20. In other words, the relative positioning in the height direction between the chip 20 and the base plate 10 is conducted so as to coincide with this distance L1 to a target value. With this design, each external surface of the multiple chips 20 arranged on the base plate 10 can be arranged within the same plane even though there is thickness unevenness in the chips 20 or the base plate 10.

According to the process, the chips 20 can be arranged on the base plate 10 via the plugs 30, respectively. In this junction structure, the chip 20 can be easily replaced by the removal of the plug 30 from the base plate 10.

Furthermore, processing the internal surface of the base plate 10, which is the side where the chips 20 are arranged, to be liquid-repellent with regard to the forming material (liquid material) of the joining member 40 enables the prevention of the flow of the joining member 40 onto the base plate 10 at the time of joining the chips 20. This design results in the prevention of the arrangement of the joining member other than on the joint surface 30a of the plug 30, and results in the prevention to become difficult to replace the chip 20 by generating the joining force other than at the target location. In this case, a contact angle on one surface of the base plate 10 relative to the forming material of the joining member 40, for example, is 50 [deg] or greater, preferably, between 70 [deg] and 110 [deg]. The region to process to be liquid-repellent on one surface of the base plate 10 does not have to be the entire surface, but can be partial, such as a peripheral region of the hole 10a.

Moreover, since the joint surface 30a of the plug 30 is processed to be affinitive relative to the forming material of the joining member 40, the joining member 40 is preferably arranged on the plugs 30 at the time of joining the chips 20. This also enables the prevention of the arrangement of the joining member other than on the joint surface 30a of the plug 30.

As the liquid-repellent processing, for example, a method to form a self-assembled monolayer on a member surface, a method to provide the plasma processing (for example, $CF_4$ plasma processing) and a method to apply a polymer compound with the liquid-repellent property onto a member surface can be mentioned. With any liquid-repellent processing, a high liquid-repellent property can be added to the surface of the member. In the meantime, as the affinitive processing, a method to irradiate ultraviolet ray with predetermined wavelength (for example, 170 to 400 nm), a method to expose the member to the ozone atmosphere and a plasma processing ($O_2$ plasma processing) method where oxygen is used as reaction gas in the atmosphere can be mentioned.

In the self-assembled film forming method, a self-assembled film composed of an organic molecular film is formed. The organic molecular film for processing the surface of the plate is equipped with a functional group incorporable to the plate; a functional group to reform the surface nature of the plate (to control the surface energy), such as a affinitive group or a liquid-repellent group, on the opposite side; and a carbon straight chain to connect these functional groups or a partially branched carbon chain, and it is joined to the substrate and self-assembled, and a molecular film, such as monolayer, is formed.

The self-assembled monolayers (SAMs) are layers to be manufactured using a self-assembly method, which is a method to secure the molecule to the solid surface, and which is a method where high density molecular layer is formable. The self-assembly method can be operated in the molecular environment and the geometry in an angstrom order. Moreover, the self-assembled monolayer can be a dominant meahs of the solidification technology of organic molecules, and because of the simplicity of the manufacturing method and a chemical joining member existing between the molecular and plate, the thermal stability of the film is high, so it is an important technology for manufacturing the molecular device in the angstrom order. Moreover, the self-assembled monolayers are basically a self-assembled process, and can spontaneously form a minute pattern. In other words, the self-assembled monolayers can simply form a fine and sophisticated pattern.

As the compound having high orientation, each compound is orientated to position a fluoroalkyl group on the surface of the film and a self-assembled film is formed, for example, by using fluoroalkylsilane, and a uniform liquid-repellent property is provided to the surface of the film.

Moreover, as the compound to form the self-assembled film, fluoroalkylsilane (hereafter, referred to as FAS), such as heptadecafluoro-1,1,2,2 tetrahydrodecyltriethoxysilane, heptadecafluoro-1,1,2,2 tetrahydrodecyltrimethoxysilane, heptadecafluoro-1,1,2,2 tetrahydrodecyltrichlorosilane, tridecafluoro-1,1,2,2 tetrahydrodecyltriethoxysilane, tridecafluoro-1,1,2,2 tetrahydrodecyltrimethoxysilane, tridecafluoro-1,1,2,2 tetrahydrodecyltrichlorosilane, or trifluoropropyltrimethoxysilane, can be mentioned. On the occasion of use, one compound can be independently used, and two or more types of compounds in combination can be used. Using FAS enables the obtainment of adhesive property with and excellent liquid-repellent property regard to the plate.

FAS is generally expressed with a structural formula $R_nSiX_{(4-n)}$. Herein, symbol 'n' indicates an integer number between 1 and 3, and symbol 'X' is a hydrolysis group, such as methoxy group, ethoxy group or halogen atom. Symbol 'R' is a fluoroalkyl group, and has a structure of $(CF_3)(CF_2)x(CH_2)y$ (herein, symbol 'x' indicates an integer number between 0 and 10, and symbol 'y' indicates an integer number between 0 and 4). When multiple Rs or Xs are joined to Si, these Rs or Xs can be all the same or different, respectively. The hydrolysis group indicated with X forms silanol by hydrolysis, and it is related with a hydroxyl group in the substrate, such as plate (glass or silicon), and joined with the plate via a siloxane binding. In the meantime, since R has a fluoro group, such as $(CF_3)$, on the surface, the substrate surface, such as a plate, is reformed to a non-wet surface (low surface energy).

In the plasma processing method used for liquid repellency, plasma is irradiated to a plate at normal pressure or in vacuum. The gas type to be used for the plasma processing can be variously selected by taking the surface material of the plate, into consideration. As the processing gas, for example, tetrafluoromethane, perfluorohexane, and perfluorodecan can be mentioned as examples.

The processing to process the surface of the plate to be liquid-repellent can also be conducted by attaching a film having a desired liquid-repellent property, such as tetrafluoroethylene-processed polyimide film, onto the surface of the substrate. Moreover, the polyimide film can be used as a plate as it is.

Moreover, when the plate surface has a higher liquid-repellent property compared to the desired one, the surface condition can be controlled by processing to change the surface of the plate to be affinitive with the irradiation of ultraviolet ray with 170 to 400 nm or the exposure of the plate to the ozone atmosphere.

Figure 6:
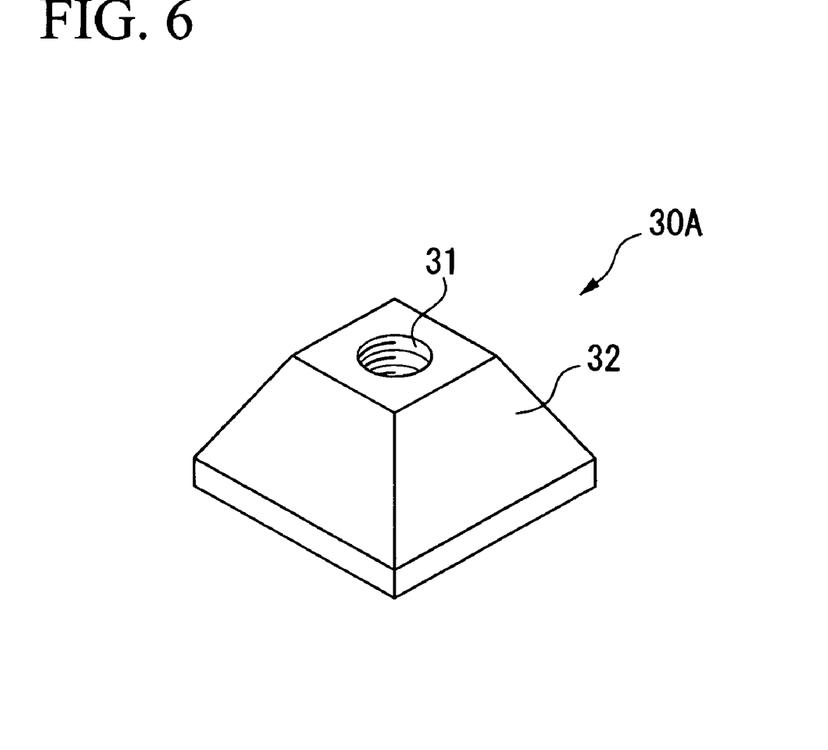
FIG. 6 shows a modified example of the plug shown in FIG. 4.
Figure 7:
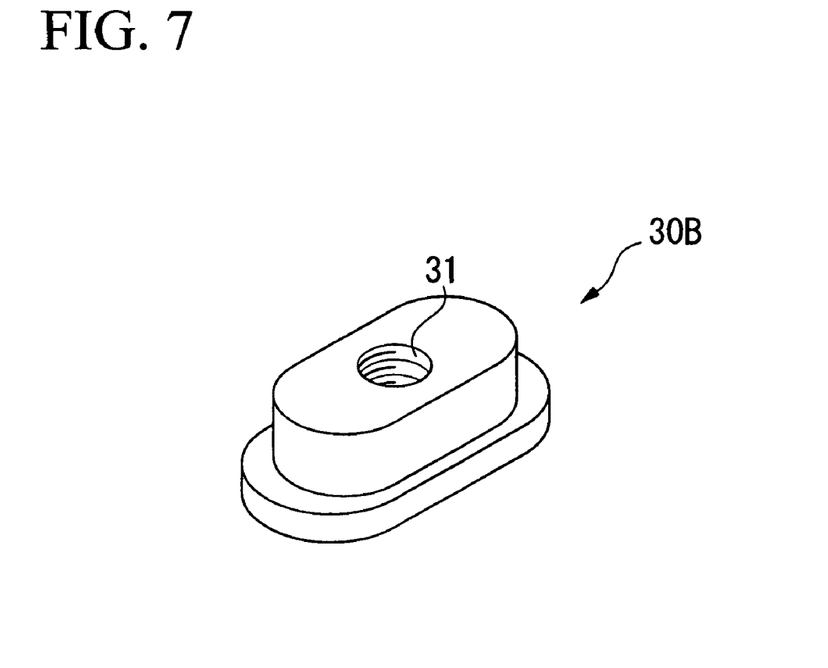
FIG. 7 shows a modified example of the plug shown in FIG. 4.

FIG. 6 and FIG. 7 show modified examples of the plug 30 shown in FIG. 4. The plug 30A in FIG. 6 is formed from overall substantially quadrangular pyramid shape. The appearance of the plug 30A has four substantial planes arranged around the axis of the plug 30A. The transverse section of the plug 30A is a polygonal. The top of the plug 30A is processed to be a vertical plane relative to the central axis, and the screw 31 with predetermined depth is established on the top. The configuration of the hole 10a in the base plate 10 (refer to FIG. 3) is determined based upon the configuration of the plug 30A. The internal wall of the hole 10a in the base plate 10 has four substantial planes arranged around the axis of the hole 10a. The transverse section of the hole 10a has a polygonal configuration substantially the same as that of the plug 30A.

The plug 30A is substantially conic as similar to the plug 30 shown in FIG. 4, so the radial position displacement relative to the hole 10A in the base plate 10 (refer to FIG. 3) is prevented. Furthermore, the plug 30A is asymmetrical relative to the hole 10a in the base plate 10 (refer to FIG. 3), which is different from the plug 30 shown in FIG. 4. In other words, since each transverse section of the plug 30 and hole 10a has a polygonal configuration, the external surface of the plug 30A makes contract with the internal wall of the hole 10a, and the plug 30A cannot rotate. Consequently, the rotation of the plug 30A within the hole 10a of the base plate 10 is prevented, and engagement of the bolt 50 with the plug 30A (refer to FIG. 3) and the removal of the bolt 50 from the plug 30A become easy.

A plug 30B shown in FIG. 7 has a transverse sectional configuration. This plug 30B is asymmetrical relative to the hole 10a of the base plate 10 (refer to FIG. 3) as similar to the plug 30A shown in FIG. 6. Therefore, the engagement of the bolt 50 with the plug 30B (refer to FIG. 3) and the removal of the bolt 50 from the plug 30B are easy. Furthermore, the configuration of the hole 10a in the base plate 10 (refer to FIG. 3) is appropriately determined based upon the configuration of the plug 30B.

Figure 8:
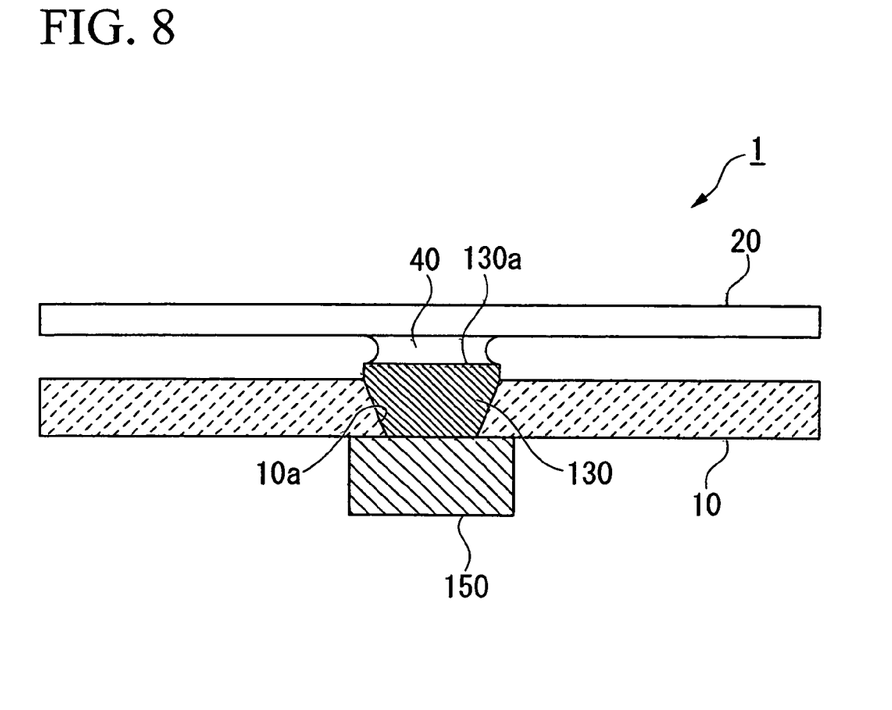
FIG. 8 is a view showing a modified example of the junction structure of a chip shown in FIG. 3.
Figure 9:
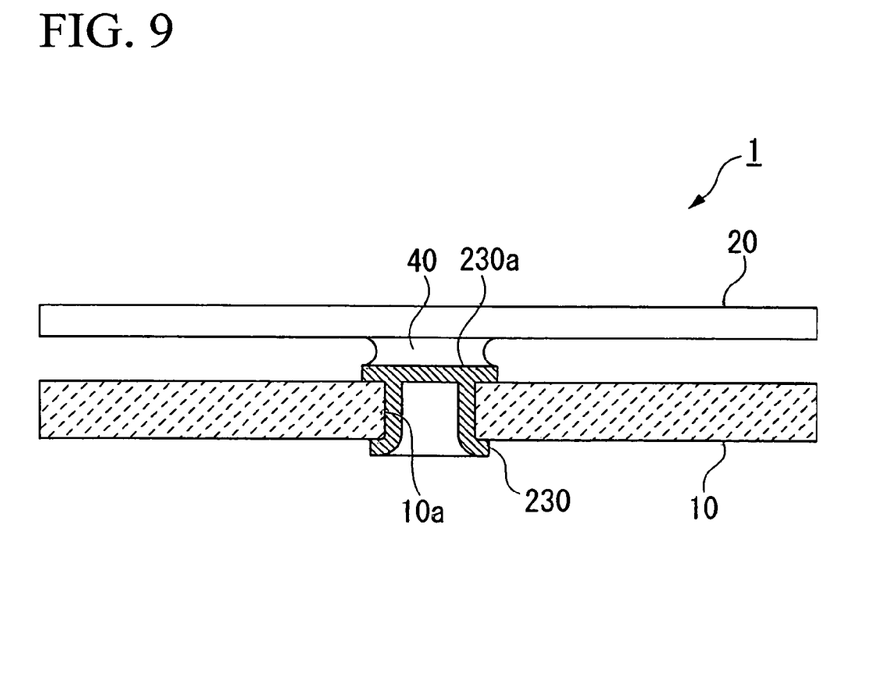
FIG. 9 is a view showing a modified example of the chip junction structure shown in FIG. 3.

FIG. 8 and FIG. 9 show modified examples of the junction structure of the chip 20 shown in FIG. 3. In the junction structure of the chip 20, a plug 130 formed from a material, which is magnetically attracted, is inserted into the hole 10a in the base plate 10. The plug 130 has an overall substantially conical configuration, and the top is processed to be a plane vertical to the central axis.

The plug 130 is inserted into the inside of the hole 10a in the base plate 10 from the top. The hole 10a in the base plate 10 is formed having a slope based upon the configuration of the plug 130. The slope of the hole 10a in the base plate 10 and the slope of the plug 130 are in a scaling relationship, and these make close contact with each other. The plug 130 inserted into the hole 10a in the base plate 10 is secured to the base plate 10 by a magnet 150. The magnet 150 is arranged on the base plate 10 from the opposite side from the plug 130.

One end surface (joint surface 130a) of the plug 130 inserted into the hole 10a in the base plate 10 is positioned higher compared to the surface (internal surface) of the base plate 10. The joining member 40 is arranged on the joint surface 130a of this plug 130, and, between the plug 130 and the chip 20. As a forming material of the joining member 40, for example, a hardening joining member, such as heat-curable joining member or a photo-curable joining member, is used. As described above, the plug 30 is secured to the base plate 10 by the magnet 150; concurrently, the chip 20 is joined with the plug 130 by the joining member 40, so the chip 20 is arranged on the base plate 10.

A forming material of the plug 130 can be a material that is magnetically attracted to the magnet 150, and well-known various materials, such as carbon steel passivated by Cr or Ni alloy, are applicable. As the forming material of the plug 130, using a soft magnetic material with small coercitivity, such as permalloy or silicon steel plate, enables the prevention of adhesion of foreign materials having magnetism onto the plug 130. This is effective for the prevention of stain on the plug 130 or damage of the mask 1 due to the collision by foreign materials. Moreover, using a martensite-series material, such as SUS410 or SUS404C, results in the prevention of the corrosion of the plug 130.

As the magnet 150, well-known various magnets are applicable, and one that can form a strong magnetic field is preferably used. As a magnetic that can form a strong magnetic field, a rare-earth magnet, such as a samarium-cobalt magnet or neodymium magnet, can be mentioned. Among them, since the neodymium magnet has great mechanical strength and it is hardly chipped, it is effective for dust control. Using the magnetic that can form strong magnetic filed results in the obtainment of a smaller size of the magnet 150 and the plug 130.

In this junction structure, the removal of the plug 130 from the base plate 10 enables the easy replacement of the chip 20. The plug 130 is easily removed by the detachment of the magnet 150. In other words, the detachment of the magnet from the plug 130 enables the easy removal of the chip 20 from the base plate 10.

In addition, in this junction structure, since the plug 130 has a substantially conical configuration, the slope of the plug 130 and the internal wall surface (slope) of the hole 10a of the base plate 10 make close contact with each other, and it is difficult for the position displacement based upon the gap between the hole 10a of the base plate 10 and the plug 130 to occur. In other words, the radial position displacement of the plug 130 with respect to the hole 10a in the base plate 10 is prevented, and as a result, the position displacement of the chip 20 with respect to the base plate 10 is prevented.

Next, in the junction structure of the chip 20 shown in FIG. 9, a plug (rivet 230) having a rivet structure is inserted into the hole 10a in the base plate 10. The rivet 230 is deformed after being inserted into the hole 10a in the base plate 10, and it is secured to the base plate 10.

The end surface (joint surface 230a) of one rivet 230 inserted into the hole 10a of the base plate 10 is positioned higher compared to the surface (inside surface) of the base plate 10. Then, the joining member 40 is arranged on the joint surface 230a of the rivet 230 and between the rivet 230 and the chip 20. As a forming material of the joining member 40, for example, a curable joining member, such as a heat-curable joining member or a photo-curable joining member, is used. As described above, the chips 20 are arranged on the base plate 10 by securing the rivet 230 to the base plate 10; concurrently, by joining the chip 20 to the rivet 230 with the joining member 40.

As a forming material of the rivet 230, easily deformable materials are acceptable, and for example well-known various materials, such as aluminum or brass, are applicable.

Figure 10A:
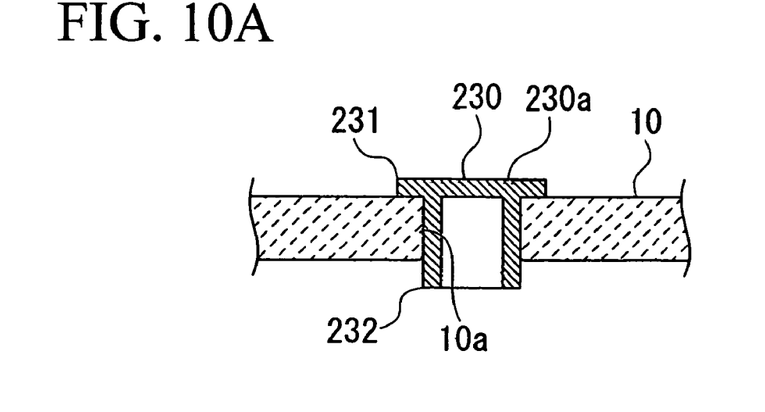
FIGS. 10A, 10B, and 10C are views showing one example of procedures to mount a chip onto a base plate using a rivet.
Figure 10B:
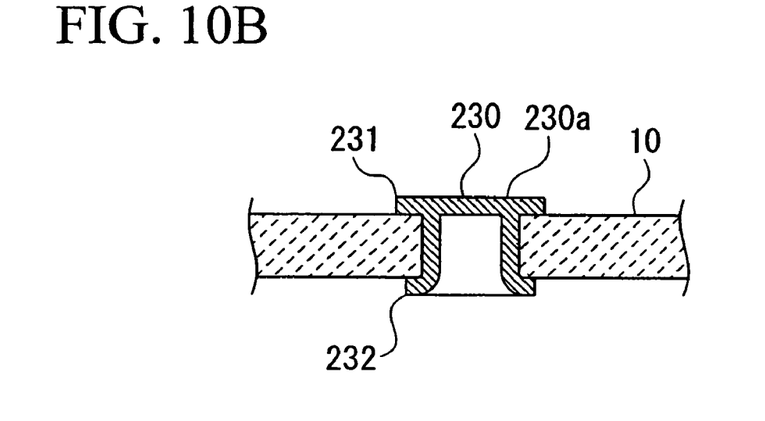
Figure 10C:
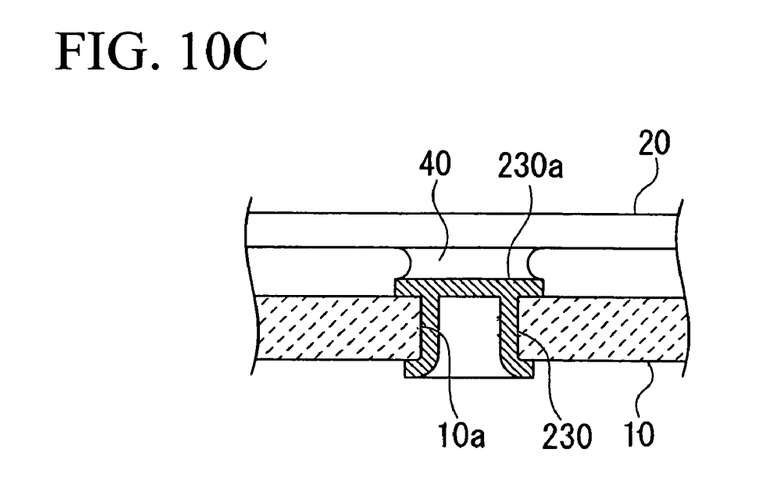

FIGS. 10A, 10B and 10C show one example of procedures to mount the chip 20 onto the base plate 10 using the rivet 230.

First, as shown in FIG. 10A, the rivet 230 before being deformed is inserted into the inside of the hole 10 in the base plate 10. The rivet 230 before being deformed includes a disc-state base 230a and a cylinder part 230b extending to the axial direction from the base 230a. Moreover, the diameter of the cylinder part 230b is smaller than that of the base 230a. The rivet 230 is inserted into the hole 10a in the base plate 10 from the cylinder part 230b as a head. When the base 230a of the rivet 230 makes contact with one surface of the base plate 10, the end of the cylinder part 230b of the rivet 230 protrudes from the opposite surface of the base plate 10.

Next, as shown in FIG. 10B, the end of the cylinder part 230b of the rivet 230 is deformed (by caulking), and this results in the securing of the rivet 230 to the base plate 10.

Next, as shown in FIG. 10C, the joining member 40 is arranged on the joint surface 230a of the rivet 230. For the arrangement of this joining member 40, an inkjet method or a dispenser method is adoptable. However, especially the inkjet method is preferably used because a desired amount of the material can be arranged at a desired position. Alternatively, fixing a dry film can arrange the joining member 40.

Subsequently, the chip 20 is arranged on the base plate 10 via the joining member 40 on the rivet 230; concurrently, the joining member 40 is cured. At this time, the chip 20 in the plane direction (orientation) is positioned, and the chip 20 in the height direction is positioned, relative to the base plate 10.

According to the processes, the chip 20 can be arranged on the base plate 10 via the rivet 230. Then, in this junction structure, the removal of the rivet 230 from the base plate 10 enables easy replacement of the chip 20.

Figure 11:
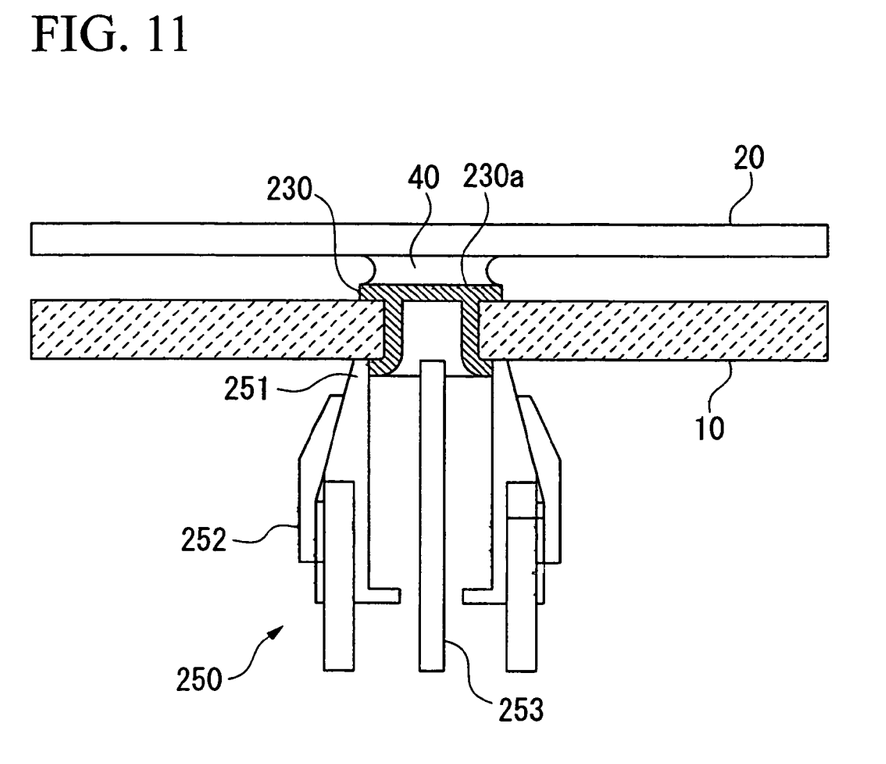
FIG. 11 is an explanatory view of the removal tool for a rivet.

The rivet 230 is easily removable by using an exclusive tool 250 as shown in FIG. 11. Furthermore, in FIG. 11, a symbol 251 indicates a stock vice for deforming the cylinder part 230b of the rivet 230, and a symbol 252 indicates a fastening ring, and a symbol 253 indicates a pushrod.

In the junction structure shown in FIG. 9, as a forming material of the rivet 230, a shape-memory alloy can be used. In this case, a deforming point of the shape-memory alloy is set at higher temperature than vapor deposition temperature (such as 80° C.) using the mask 1, for example, at 100° C. The deforming point for the shape-memory alloy can be set by the composition adjustment. Moreover, the restoration of the shape of the rivet 230 by heating with a heating or heating via power distribution enables the easy removal of the rivet 230 made from the shape-memory alloy.

Figure 12:
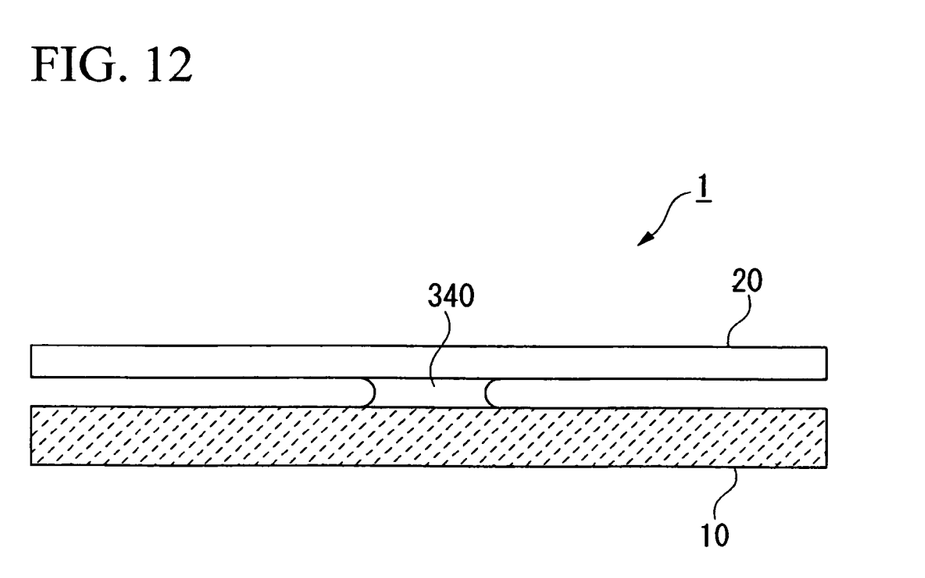
FIG. 12 is a view showing another modified example of the junction structure of a chip shown in FIG. 3.

FIG. 12 shows another modified example of the chip 20 shown in FIG. 3. In the junction structure of the chip 20 shown in FIG. 12, a joining member 340 is directly arranged on the base plate 10, and the base plate 10 and the chip 20 are joined via this joining member 340. Then, as the joining member 340, a material that can control the joining force is used.

As the joining member 340, for example, it can be composed by including at least a thermoplastic resin (such as a hot-melt adhesive), a soluble resin (such as a soluble adhesive), and polysulfone resin. In this case, the deforming point of the joining member 340 is set at the higher temperature than the vapor deposition temperature (for example, 80° C.) using the mask 1, for example at 100° C. Moreover, in this case, the joining force of the joining member 340 can be controlled using at least one of a thermal means, a chemical means or an optical means.

In this junction structure, the control of the joining force of the joining member 340 enables the easy replacement of the chip 20. In other words, the chip 20 can be easily removed from the base plate 10 by reducing the joining force of the joining member.

For example, when the hot-melt adhesive where the thermoplastic resin is a main ingredient is used as the joining member 340, heating the joining member 340 by the irradiation of the laser beam enables the lowering of the joining force of the joining member 340.

Moreover, for example, when the soluble resin (such as, a soluble adhesive) is used as the joining member, supplying a predetermined solution (for example, water) to the joining member 340 enables the lowering of the joining force of the joining member 340.

Moreover, for example, when polysulfone resin is used as the joining member 340, the joining force of the joining member 340 can be reduced by cutting the molecular binding of the polymer material in the joining member 340 by the irradiation of an excimer laser. As this polysulfone resin, for example, polyimide resin, polyester resin, epoxy resin, polyurethane resin, and acrylic resin can be mentioned.

As described above, the junction structure of the chip 20 to be used for the mask of the present invention was explained. However, configuration, material and the number in each component, such as a plug or a joining member, are appropriately changeable, and these are not limited to the explanation.

Figure 13:
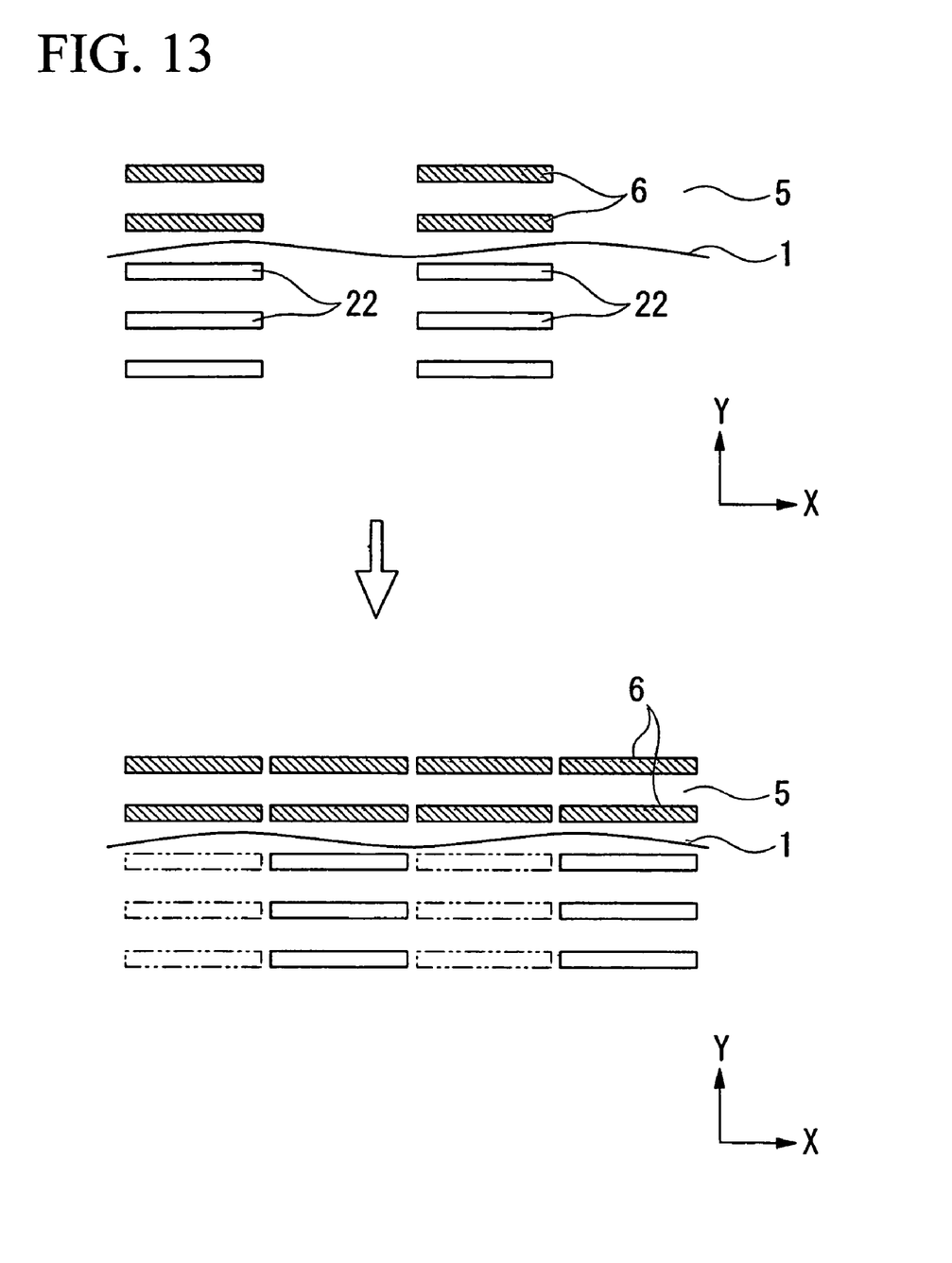
FIG. 13 is a view showing a pattern formed in the mask shown in FIG. 1.

FIG. 13 shows a pattern to form a film with the mask 1 shown in FIG. 1. As shown in FIG. 13, when particles from the vapor deposition source pass through the aperture patterns 22, film formation patterns 6 with the same configuration as that of the aperture patters 22 are formed on the one surface of the deposition target substrate 5. The film formation patterns 6 to be formed by the mask 1 include multiple lines (linear pattern lines) where multiple linear patterns are arranged in the latitudinal direction (Y direction) thereof and these are equally spaced. These multiple linear pattern lines are arranged in the longitudinal direction (X direction) at intervals with each other.

In the embodiment, at least two vapor depositions are conducted to the one deposition target substrate 5 using the same mask 1. In other words, after the first deposition of the film formation patterns 6 is conducted onto the deposition target substrate 5, the relative position of the mask 1 with respect to the deposition target substrate 5 is shifted, and the second deposition of the film formation patterns 6 is conducted to the deposition target substrate 5. On this occasion, the second film formation patterns 6 are formed in the region in between the multiple linear pattern lines in the first film formation patterns 6. This results in the formation of the film formation patterns 6 on the entire surface of the deposition target substrate 5. Furthermore, as described below, in the manufacturing of the organic EL panel, the two film formations are conducted to R, G and B, respectively.

As described above, the case using the mask of the present invention for the vapor deposition method was explained. However, the present invention is not limited to this, but the mask of the present invention is applicable to other film formation methods, such as a sputter method or a CVD method.

Manufacturing Method for Electro-Optic Device

Figure 14A:
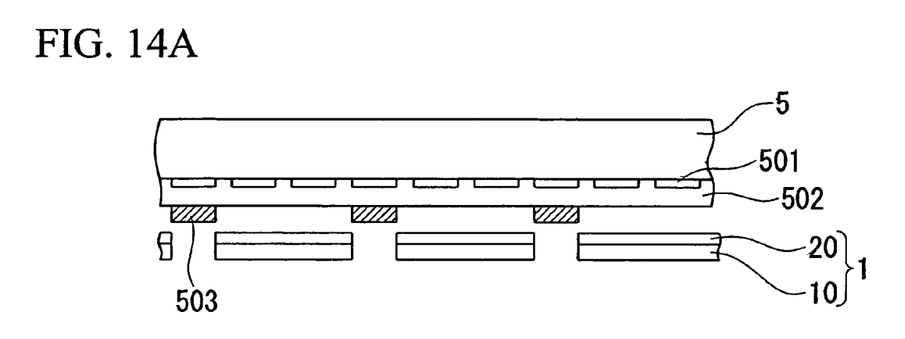
FIGS. 14A, 14B, and 14C are pattern cross sectional views showing one example of the electro-optic device manufacturing method of the present invention.
Figure 14B:
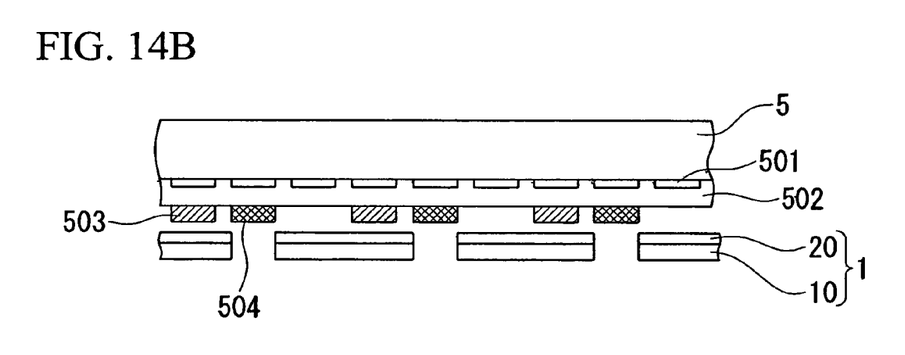
Figure 14C:
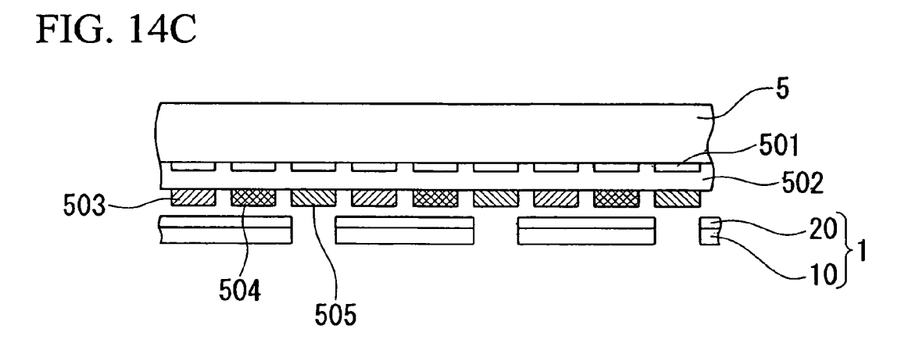

Next, a manufacturing method for an organic EL device is described as one example of the electro-optic device manufacturing method of the present invention. FIGS. 14A to 14C are pattern cross sectional views showing one example of the electro-optic device manufacturing method of the present invention.

In the Embodiment, a film of a luminescent material is formed onto the deposition target substrate 5 using the mask 1. The luminescent material is, for example, an organic material. There is aluminum quinolinol complex ($Alq_3$) as a low molecular organic material, and polyparaphenylene vinylene (PPV) as a macromolecular material. The vapor deposition enables the film formation of the luminescent material. The substrate 5 is for forming multiple EL devices (organic EL elements), and it is a transparent substrate, such as a glass substrate. An electrode (for example, a clear electrode formed from ITO) 501 as shown in FIG. 14 and a hole transporting bed 502 are formed in the substrate 5 as shown in FIG. 14A. An electronic transport layer can be formed.

First, as shown in FIG. 14A, a film of a red luminescent material is formed on the substrate 5 via the mask 1, and a red luminescent layer 503 is formed. Subsequently, as shown in FIG. 14B, the mask 1 is shifted and a film of a green luminescent material is formed onto the substrate 5, and a green luminescent layer 504 is formed. In addition, as shown in FIG. 14C, the mask 1 is shifted again, and a film of a blue luminescent material is formed onto the substrate 5, and a blue luminescent layer 505 is formed.

Herein, in the mask shown in FIG. 1, the multiple openings 12 are formed in the base plate 10, and chips 20 are arranged in the opening 12, respectively. Using this mask 1 enables the manufacturing of the organic EL device corresponding to a large screen with high accuracy.

When the organic luminescent layers 503, 504 and 505 are deposited using the mask 1 where the chips 20 are adhered and secured on the base plate 10, contact between the mask 1 and the substrate 5 is repeated multiple times within a vacuum chamber. Moreover, a substance may physically make contact with the chip 20 in the operation to remove an organic film attached to the chip 20 using $O_2$ plasma. This may cause damage or breakage of the chip 20. When damage or breakage occurs to a portion of the chips 20, the chip(s) is repaired by replacement. Adopting the mask 1 where multiple chips 20 are arranged on the base plate 10 enables the replacement of the portion of the chips 20 where nonconformity (damage or breakage) has occurred with new one, so it is advantageous for the reduction of the manufacturing cost. In addition, because the removal of the chips 20 is easy, the mask 1 is repaired in a short time with less labor, and the high quality of the mask 1 is economically maintained.

Figure 15:
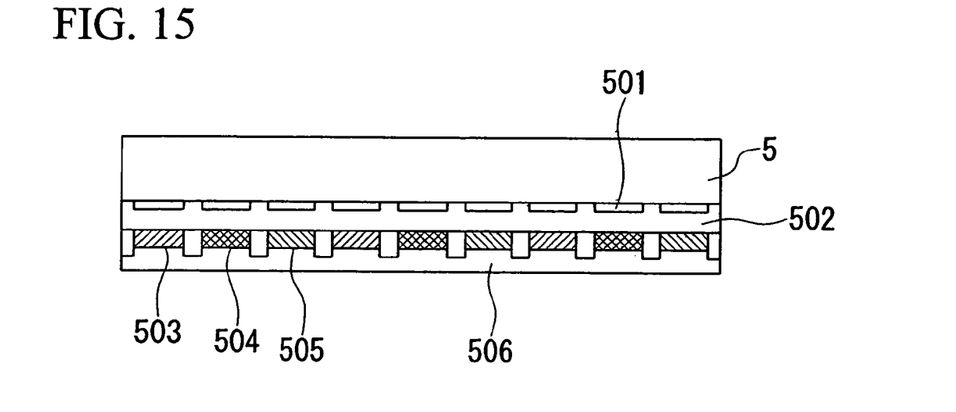
FIG. 15 is a schematic cross-sectional view showing an overall construction of the organic EL device manufactured by the manufacturing method.

FIG. 15 is a pattern cross sectional view showing the outline construction of the organic EL device manufactured using the manufacturing method. The organic EL device has the substrate 5, the electrode 501, the hole transporting bed 502, the red luminescent layer 503, the green luminescent layer 504 and the blue luminescent layer 505. The electrode 506 is formed on the luminescent layers 503, 504 and 505. The electrode 506 is, for example, a cathode electrode. The organic EL device in the embodiment is preferably applied as a display unit (display). Using the organic EL device where the pattern displacement of the luminescent layers 503, 504 and 505 is less results in the provision of the display unit with a bright large screen without unevenness.

Electronic Apparatus

Figure 16:
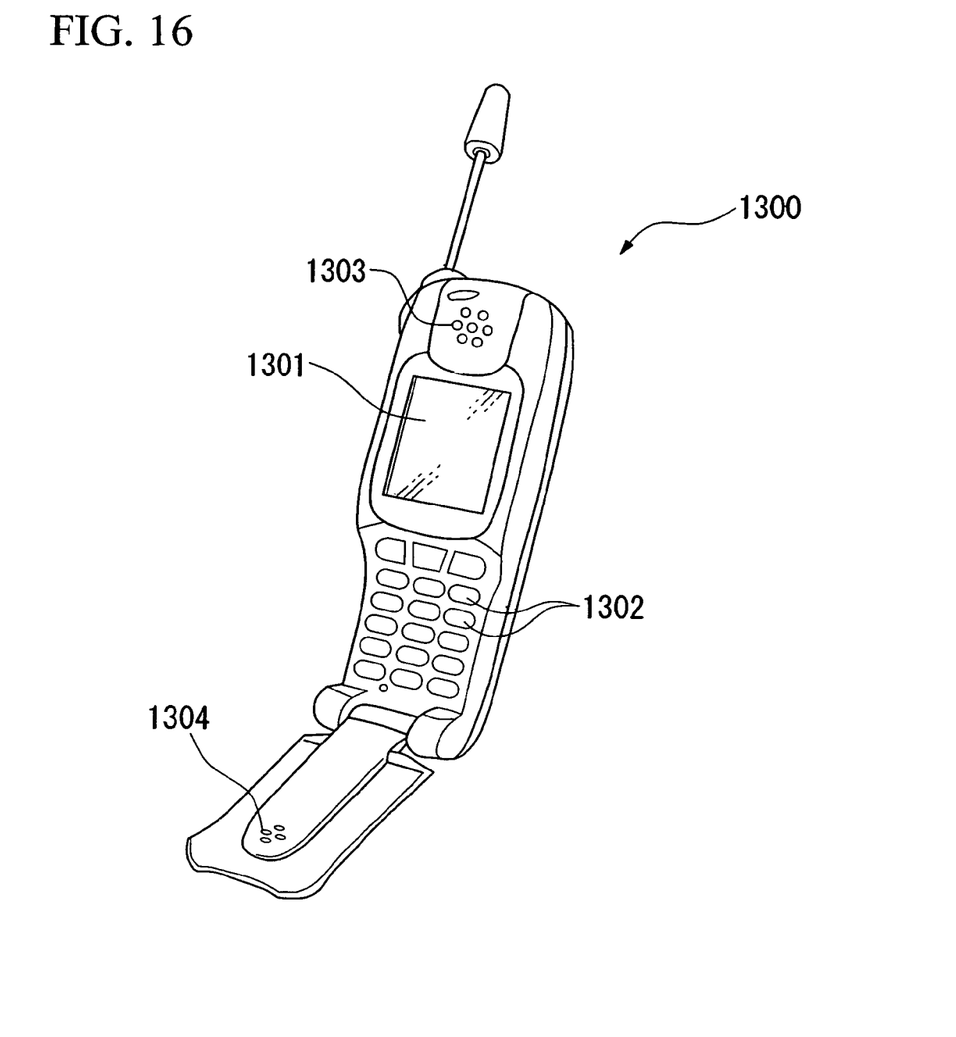
FIG. 16 is a perspective view showing one example of the electronic apparatus relating to the present invention.

FIG. 16 is a perspective view showing one example of the electronic apparatus relating to the present invention. A mobile phone 1300 shown in this diagram is equipped with a small-sized display 1301 where the organic EL device is applied, multiple operating buttons 1302, an ear piece 1303 and a mouthpiece 1304.

The electro-optic device of the present invention is not limited to the mobile phone, but it can be preferably applied to various electronic devices, such as an electronic book, a personal computer, a digital still camera, a liquid crystal television, a view-finder type or monitor direct-vision type video tape recorder, a car navigation system, a pager, a personal organizer, a calculator, a word processor, a work station, a TV telephone, a POS terminal, or a device equipped with touch panel. Moreover, as the electro-optic device of the present invention, it is not limited to the organic EL device, but it is preferably applied to a liquid crystal device, a plasma display device (PDP) and a field emission display (FED).

As described above, the preferable embodiments of the present invention were explained. However, the present invention is not limited to these embodiments. Addition, omission, replacement and other modification of the construction are possible without departing from the scope of the present invention. The present invention will never be the limited by the described explanation, but it is limited only by the attached scope of claims.

What is claimed is:

1. A mask, comprising:
a base plate having an opening and a plurality of holes, the holes provided apart from each other;
a chip having an aperture pattern positioned at the opening in the base plate;
a plurality of plugs detachably arranged to the base plate, the plugs being inserted in the holes respectively and supporting the tip; and
a joining member joining the chip and the plug, the joining member disposed between a surface of the chip and a surface of each of the plugs, the surface of the chip and the surface of each of the plugs facing each other, the joining member disposed at a plurality of positions on the surface of the chip, the positions
being apart from each other;
wherein a surface of the base plate is liquid repellent to a forming material of the joining member, the surface of the base plate being on a side where the chip is arranged.

2. The mask according to claim 1, wherein the plug is formed from a material different from that of the base plate.

3. The mask according to claim 1, wherein a surface of the plug is liquid affinitive to a forming material of the joining member, the surface of the plug being joined to the chip.

4. The mask according to claim 1, wherein the joining member has at least either photo-curability or heat-curability.

5. The mask according to claim 1, wherein
the plug has a screw engaged with a bolt that secures the plug in the hole of the base plate.

6. The mask according to claim 5, wherein the plug has a substantially conical shape.

7. The mask according to claim 5, wherein the plug has an asymmetrical shape with respect to the hole of the base plate.

8. The mask according to claim 1, wherein the plug has a rivet structure.

9. The mask according to claim 8, wherein the plug is formed from aluminum or brass.

10. The mask according to claim 8, wherein the plug is formed from a shape-memory alloy.

11. The mask according to claim 1, wherein
the plug is formed from a material, which is magnetically attracted to a magnet.

12. The mask according to claim 11, wherein the plug has a substantially conical shape.

13. The mask according to claim 1, wherein the surface of the plug is disposed at a higher position than a surface of the base plate.

14. The mask according to claim 1, wherein a gap is provided between the chip and the base plate except at the positions.

15. A mask, comprising:
a base plate having an opening and a plurality of holes, the holes provided apart from each other;
a chip having an aperture pattern positioned at the opening in the base plate; and
a joining member joining the base plate and the chips, the joining member disposed between a surface of the chip and a surface of the plug, the surface of the chip and the surface of the plug facing each other, the joining member disposed at a plurality of positions on a surface of the chip, the positions being apart from each other, wherein a joining force of the joining member is controllable.

16. The mask according to claim 15, wherein the joining force of the joining member is controlled using at least one of:
means for thermal processing;
means for chemical processing; and
means for optical processing.

17. The mask according to claim 16, wherein the chip can be removed from the base plate by reducing the joining force of the joining member.

18. The mask according to claim 15, wherein the joining member has at least one of a hot-melt adhesive, a soluble resin, and a polysulfone resin.

19. The mask according to claim 18, wherein the chip can be removed from the base plate by reducing the joining force of the joining member.

20. The mask according to claim 15, wherein a gap is provided between the chip and the base plate except at the positions.

* * * * *